United States Patent
Brittain et al.

(10) Patent No.: US 8,996,824 B2
(45) Date of Patent: *Mar. 31, 2015

(54) MEMORY REORDER QUEUE BIASING PRECEDING HIGH LATENCY OPERATIONS

(71) Applicant: International Business Machines Corporation, Armonk, NY (US)

(72) Inventors: Mark A. Brittain, Austin, TX (US); John S. Dodson, Austin, TX (US); Stephen Powell, Austin, TX (US); Eric E. Retter, Austin, TX (US); Jeffrey A. Stuecheli, Austin, TX (US)

(73) Assignee: International Business Machines Corporation, Armonk, NY (US)

(*) Notice: Subject to any disclaimer, the term of this patent is extended or adjusted under 35 U.S.C. 154(b) by 0 days.

This patent is subject to a terminal disclaimer.

(21) Appl. No.: 13/781,519

(22) Filed: Feb. 28, 2013

(65) Prior Publication Data

US 2014/0082272 A1    Mar. 20, 2014

Related U.S. Application Data

(63) Continuation of application No. 13/371,906, filed on Feb. 13, 2012.

(51) Int. Cl.
| | | |
|---|---|---|
| *G06F 13/00* | (2006.01) | |
| *G06F 13/28* | (2006.01) | |
| *G06F 12/00* | (2006.01) | |

(Continued)

(52) U.S. Cl.
CPC ...... *G11C 11/40607* (2013.01); *G06F 13/1626* (2013.01); *G06F 13/1689* (2013.01)
USPC ..... 711/151; 711/158; 711/106; 711/E12.075

(58) Field of Classification Search
CPC .................................................. G06F 13/1626
See application file for complete search history.

(56) References Cited

U.S. PATENT DOCUMENTS

| | | |
|---|---|---|
| 5,568,620 A | 10/1996 | Sarangdhar et al. |
| 6,298,413 B1 | 10/2001 | Christenson |
| 6,370,073 B2 | 4/2002 | Leung |

(Continued)

OTHER PUBLICATIONS

Phadke et al., "MLP Aware heterogeneous Memory System," Design, Automation & Test in Europe Conference & Exhibition Mar. 14-18, 2011.

(Continued)

*Primary Examiner* — Eric S Cardwell
(74) *Attorney, Agent, or Firm* — Yudell Isidore PLLC; Thomas E Tyson (57) ABSTRACT

A method for controlling memory refresh operations in dynamic random access memories. The method includes determining a count of deferred memory refresh operations for a first memory rank. Responsive to the count approaching a high priority threshold, issuing an early high priority refresh notification for the first memory rank, which indicates the pre-determined time for performing a high priority memory refresh operation at the first memory rank. Responsive to the early high priority refresh notification, the behavior of a read reorder queue is dynamically modified to give priority scheduling to at least one read command targeting the first memory rank, and one or more of the at least one read command is executed on the first memory rank according to the priority scheduling. Priority scheduling removes these commands from the re-order queue before the refresh operation is initiated at the first memory rank.

7 Claims, 8 Drawing Sheets

(51) Int. Cl.
*G11C 11/406* (2006.01)
*G06F 13/16* (2006.01)

(56) References Cited

U.S. PATENT DOCUMENTS

| | | | |
|---|---|---|---|
| 6,385,708 B1 | 5/2002 | Stracovsky et al. | |
| 6,564,304 B1 * | 5/2003 | Van Hook et al. | 711/154 |
| 6,587,918 B1 * | 7/2003 | Christenson | 711/106 |
| 7,043,599 B1 * | 5/2006 | Ware et al. | 711/106 |
| 7,047,374 B2 | 5/2006 | Sah et al. | |
| 7,076,587 B2 | 7/2006 | Routliffe et al. | |
| 7,277,982 B2 | 10/2007 | Calvignac et al. | |
| 7,373,471 B2 | 5/2008 | Brittain et al. | |
| 7,558,270 B1 | 7/2009 | Wilford et al. | |
| 7,724,589 B2 | 5/2010 | Rajan et al. | |
| 7,724,602 B2 | 5/2010 | Hur et al. | |
| 7,739,461 B2 | 6/2010 | Hur et al. | |
| 7,739,462 B2 | 6/2010 | Dewey | |
| 7,934,070 B2 | 4/2011 | Brittain et al. | |
| 2002/0194444 A1 | 12/2002 | Goodrich, II et al. | |
| 2009/0019341 A1 * | 1/2009 | Emma et al. | 714/769 |
| 2009/0172681 A1 | 7/2009 | Alexander et al. | |
| 2011/0099341 A1 | 4/2011 | Resnick | |
| 2011/0179240 A1 | 7/2011 | Sukonik et al. | |

OTHER PUBLICATIONS

Int'l Searching Authority, State Intellectual Property Office, China, PCT/IB2013/050138; International Search Report dated May 30, 2013 (9 pg.).

U.S. Appl. No. 13/371,906 entitled "Memory Reorder Queue Biasing Preceding High Latency Operations"; Notice of Allowance dated Jul. 29, 2014 (5 pg).

U.S. Appl. No. 13/371,906 entitled "Memory Reorder Queue Biasing Preceding High Latency Operations"; Non-final office action dated Apr. 2, 2014 (14 pg).

* cited by examiner

MEMORY REORDER QUEUE BIASING PRECEDING HIGH LATENCY OPERATIONS

PRIORITY CLAIM

The present application is a continuation of U.S. patent application Ser. No. 13/371,906, titled "Memory Reorder Queue Biasing Preceding High Latency Operations," filed on Feb. 13, 2013, the contents of which is incorporated herein by reference in its entirety.

BACKGROUND

1. Technical Field

The present disclosure generally relates to memory systems and in particular to scheduling of operations in memory systems. Still more particularly, the present disclosure relates to controlling scheduling of memory access operation and high latency memory operations in memory systems.

2. Description of the Related Art

One of the highest latency operations performed in a memory is a refresh operation. Refresh operations are periodically performed in a dynamic random access memory (DRAM), which requires periodic refresh operations in order to retain the contents of one or more memory banks. Without constant refreshing, a DRAM will lose the data written to the DRAM as memory cell capacitors leak their charge. DRAM manufacturers and standards committees have defined a maximum interval or time period between refresh operations (tREFI). A DRAM is refreshed responsive to a refresh command periodically issued by a memory controller. The refresh operation takes a time period called a refresh cycle time (tRFC) to complete. The refresh cycle is completed before the memory banks being refreshed can be accessed by a scheduled read operation.

Technological advancements have led to an increase in the capacity (or density) of DRAM chips. As the DRAMs capacity increases, so to does the refresh cycle time for each of the ranks containing the DRAMs. For low density DRAM chips, the refresh cycle time has a negligible effect on read performance. However, for high density DRAM chips, memory reads can be required to wait until the required refresh operation is completed. This long wait time can result in degraded performance for the high density DRAM chip. For example, a 1 gigabyte DRAM can have a refresh cycle time of 110 nanoseconds, while an 8 gigabyte DRAM can have a refresh cycle time of 350 nanoseconds. In contrast, a read operation to a memory location can typically be completed in 25 nanoseconds. As future DRAM chips are built with higher densities and increasing capacity, the refresh cycle time is projected to increase further.

BRIEF SUMMARY

Generally disclosed are a method for controlling high priority, high latency operations in a memory system. One specific embodiment provides a method for controlling memory refresh operations in dynamic random access memories. According to the specific embodiment, the method includes determining a count of deferred memory refresh operations for the first memory rank, and responsive to the count approaching a high priority threshold, issuing an early high priority refresh notification for the first memory rank. The high priority threshold indicates the pre-determined scheduled time for performing a memory refresh operation as a high priority memory refresh operation at the first memory rank. Responsive to the early high priority refresh notification, a read reorder queue behavior is dynamically modified to give priority scheduling to at least one read command targeting the first memory rank, and one or more of the at least one read command is executed on the first memory rank according to the priority scheduling. Priority scheduling of the read comments targeting the first memory rank removes these specific commands from the re-order queue before the refresh operation is initiated on the first memory rank.

The above summary contains simplifications, generalizations and omissions of detail and is not intended as a comprehensive description of the claimed subject matter but, rather, is intended to provide a brief overview of some of the functionality associated therewith. Other systems, methods, functionality, features and advantages of the claimed subject matter will be or will become apparent to one with skill in the art upon examination of the following figures and detailed written description.

BRIEF DESCRIPTION OF THE DRAWINGS

The description of the illustrative embodiments is to be read in conjunction with the accompanying drawings, wherein.

DETAILED DESCRIPTION

The illustrative embodiments generally disclose a method, memory system and data processing system for controlling high priority, high latency operations in a memory system. The memory system includes a memory controller having logic that tracks a time remaining before a scheduled time for performing a high priority, high latency operation a first memory rank of the memory system. The memory system is configured with a plurality of ranks that are individually accessible by different memory access operations scheduled from a command re-order queue of the memory controller. Responsive to the time remaining reaching a pre-established early notification time before the schedule time for performing the high priority, high latency operation, the memory controller logic biases the re-order queue containing memory access operations targeting the plurality of ranks to prioritize scheduling of any first memory access operations that target the first memory rank. The logic also schedules the first memory access operations to the first memory rank for early completion, relative to other memory access operations in the re-order queue that target other memory ranks. The logic then performs the high priority, high latency operation at the first memory rank at the scheduled time. The biasing of the re-order queue and scheduling of the first memory access operations triggers a faster depletion of first memory access commands remaining within the re-order queue before the high priority, high latency operation is performed at the first memory rank.

One specific embodiment provides a method and memory system for controlling memory refresh operations in dynamic random access memories. A count of deferred memory refresh operations is determined for a first memory rank. In response to the count approaching a high priority threshold, an early high priority refresh notification is issued for the first memory rank. In response to the early high priority refresh notification, a read reorder queue behavior is modified to give priority to at least one command targeting the first memory rank. The command is executed on the first memory rank. By notifying logic within the memory controller in advance of when a memory refresh is required, the memory controller logic can modify the order of execution of read commands in a read reorder queue and issue read commands targeting the same memory rank as the memory refresh prior to that operation being initiated. Read commands to other memory ranks can be issued while the high latency memory refresh operation for the memory rank being refreshed is in progress and awaiting completion. This early processing of commands improves the overall performance and utilization of the read reorder queue, the memory bus and the dynamic random access memory.

In the following detailed description of exemplary embodiments of the disclosure, specific exemplary embodiments in which the disclosure may be practiced are described in sufficient detail to enable those skilled in the art to practice the disclosure, and it is to be understood that other embodiments may be utilized and that logical, architectural, programmatic, mechanical, electrical and other changes may be made without departing from the spirit or scope of the present disclosure. The following detailed description is, therefore, not to be taken in a limiting sense, and the scope of the present disclosure is defined by the appended claims and equivalents thereof.

It is understood that the use of specific component, device and/or parameter names (such as those of the executing utility/logic described herein) are for example only and not meant to imply any limitations on the disclosure. The disclosure may thus be implemented with different nomenclature/terminology utilized to describe the components/devices/parameters herein, without limitation. Each term utilized herein is to be given its broadest interpretation given the context in which that term is utilized.

Figure 1A:
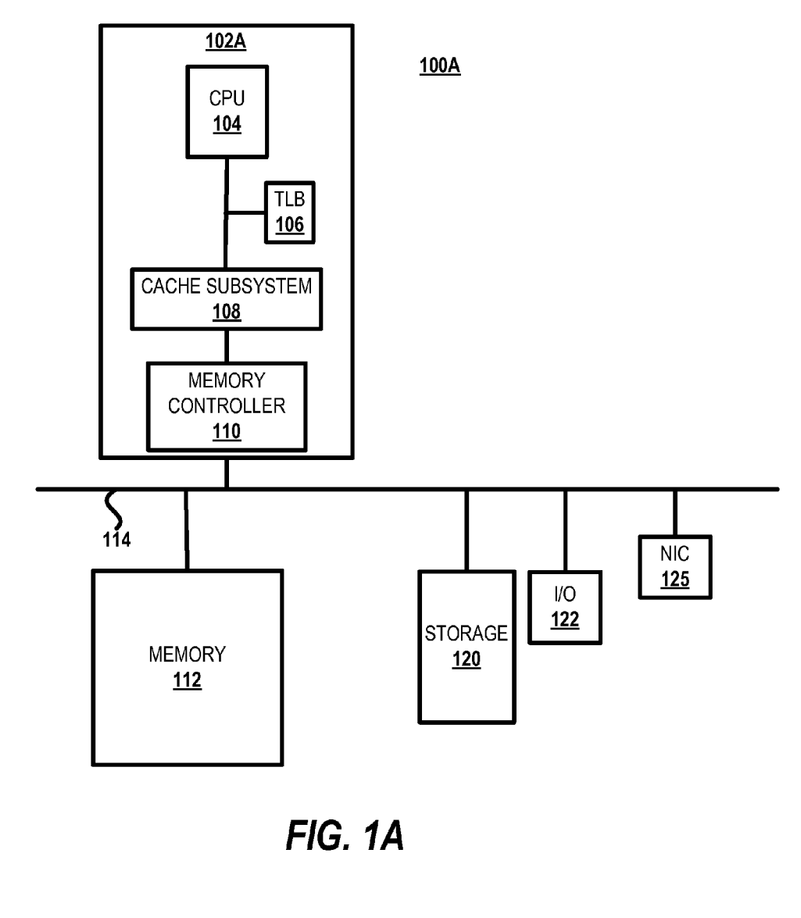
FIGS. 1A-1C provides block diagram representations of three example data processing systems within which one or more of the described embodiments are practiced.
Figure 1B:
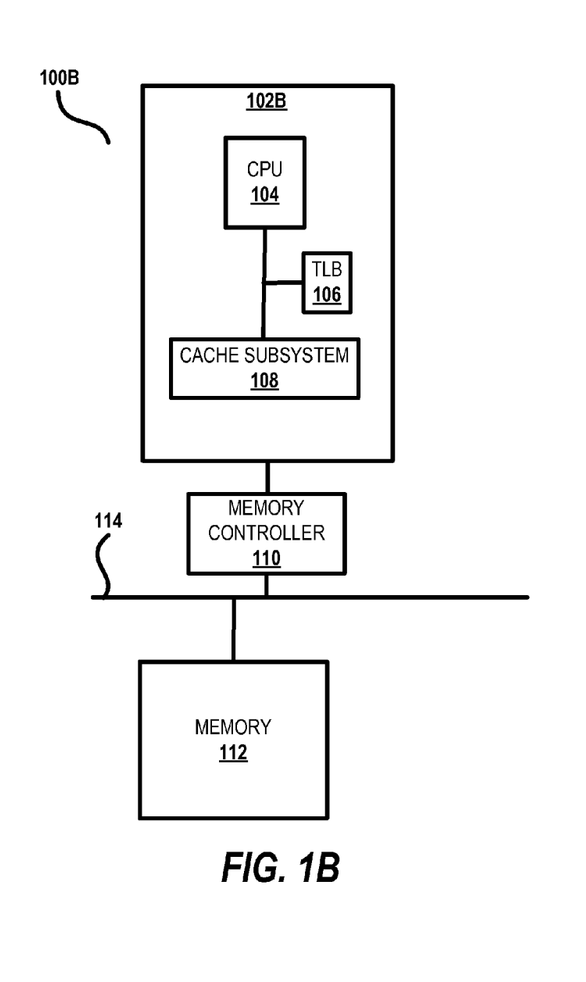
Figure 1C:
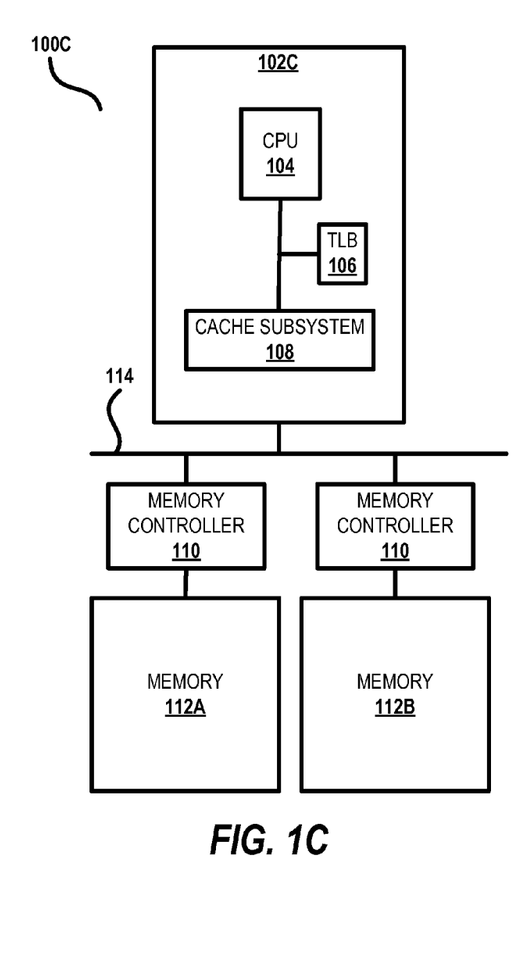

With reference now to the figures, and beginning with FIGS. 1A, 1B and 1C, there are depicted block diagram representations of example data processing system (DPS) 100, within which the embodiments can be advantageously implemented. As used herein, the term "data processing system," is intended to include any type of computing device or machine that comprises a memory subsystem that can process memory access operations having different latencies. In a more specific application of the embodiments, DPS refers to a device having a memory subsystem of dynamic random access memory (DRAM) with individually accessible subparts, generally referred to herein as ranks, and to which access is controlled by logic within a memory controller.

FIGS. 1A, 1B and 1C illustrate three different configurations of an example DPS, respectively labeled as DPS 100A, 100B and 100C. Because the three DPSs have similar components, the three configurations are described with a single description. For simplicity, references to DPS generally shall be indicated as DPS 100, while specific reference to one of the three configurations of DPS will be indicated by the A, B, or C extension to the reference numeral. Each DPS 100A, 100B, 100C respectively comprises one or more processor modules or processor chips 102A, 102B, 102C. Each processor chip 102A, 102B, 102C includes one or more central processing units (CPU), of which CPU 104 is illustrated. Throughout the description herein, the terms CPU and processor can be utilized interchangeably as referring to the same component. Each processor chip 102A, 102B, 102C further includes a translation look-aside buffer (TLB) 106 and a cache subsystem 108. Cache subsystem 108 can comprise one or more levels of caches, such as an L1 cache and an L2 cache, and one or more of the lower levels of caches can be a shared cache.

In the configuration of DPS 100A (FIG. 1A), processor chip 102A further comprises on-chip memory controller 110 and one or more system memory components of a single system memory 112 is illustrated. System memory 112 (or simply memory 112) is physically coupled to processor chip 102 via system interconnect fabric, referred to as system bus 114. As illustrated by the configurations of DPS 100B and 100C, the location of memory controller 110 as well as the number of memory controllers 110 within DPS 100 can vary based on the design of DPS 100. Thus, in FIG. 1B, memory controller 110 is separated or off-chip from processor chip 102B and coupled to system memory 112 via system bus 114. Also, in FIG. 1C, a separate memory controller 110A, 110B is provided for each system memory 112A and 112B, and each memory controller 110A, 110B is directly connected to a respective memory 112A, 112B and communicatively coupled to processor chip 102C through system bus 114.

The embodiment of DPS 100C provides a distributed system memory configuration, by which two separate system memories, memory 112A, 112B, are connect within the DPS 100 as a representative set of distributed memory. Separate memory controller(s) 110A, 110B can then be connected to the memory 112A, 112B and/or processor chips in one of the three different configurations. Regardless of the location of memory controller 110 relative to the processor chip and/or memory 112, and the number of different memories, access to system memory 112 is controlled by memory controller 110.

As further illustrated by FIG. 1, DPS 100A can include physical computer readable storage media 120 (or storage), input/output devices and corresponding controllers, generally represented as I/O 122, and a network interface card (NIC) 125, among other components. NIC 125 enables DPS 100A to connect to and communicate with other remote devices and networks.

Those of ordinary skill in the art will appreciate that the hardware components and basic configuration depicted in FIGS. 1A, 1B and 1C may vary. The illustrative components within DPS 100 are not intended to be exhaustive, but rather are representative to highlight essential components that are utilized to implement the present disclosure. For example, other devices/components may be used in addition to or in place of the hardware depicted. The depicted example is not meant to imply architectural or other limitations with respect to the presently described embodiments and/or the general disclosure. The example data processing systems depicted in FIGS. 1A, 1B, and 1C may be, for example, an IBM eServer pSeries system, a product of International Business Machines Corporation in Armonk, N.Y., running the Advanced Interactive Executive (AIX) operating system (Trademark of IBM Corporation) or LINUX operating system (Trademark of Linus Torvalds).

Figure 2:
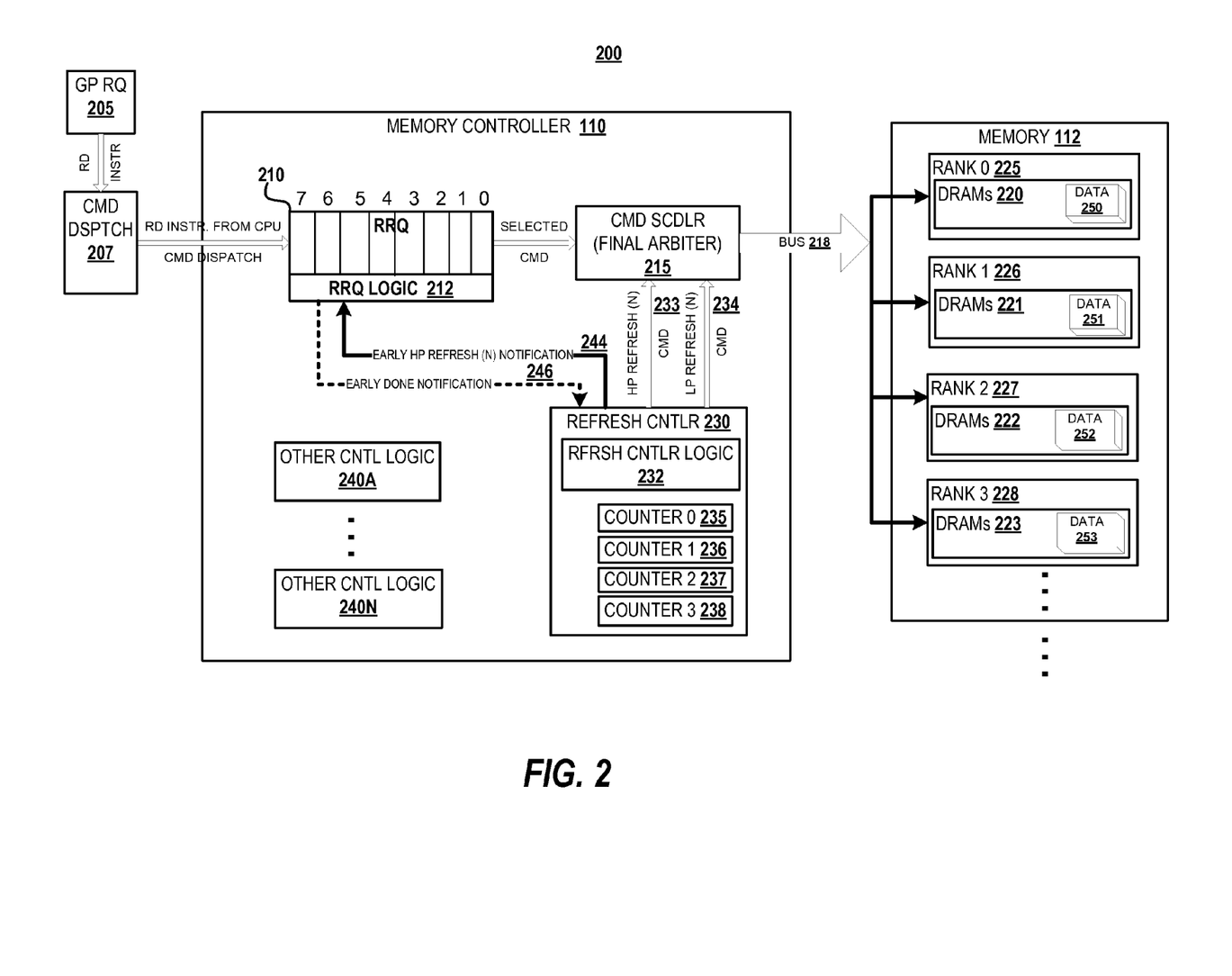
FIG. 2 illustrates a block diagram representations of an example memory system according to one or more embodiment.

FIG. 2 illustrates a block diagram of a memory access subsystem 200 that can be utilized within DPS 100. Memory access subsystem 200 generally includes memory 112 and memory controller 110 that controls and manages the flow of commands and data to and from memory 112. Memory access sub system 200 also includes a general purpose read queue (GPRQ) 205 and command dispatch logic 207. GPRQ 205 contains entries for holding read commands issued from CPU 104 of DPS 100 (FIGS. 1A, 1B, 1C) to be executed on memory 112. General purpose read queue 205 can be a first in first out queue. GPRQ 205 is communicatively connected to command dispatch 207, which is communicatively connected to read re-order queue (RRQ) 210 of memory controller 110. Command dispatch 207 forwards read commands or instructions from GPRQ 205 to read reorder queue 210, when RRQ 210 has open entries for receiving new commands for scheduling to memory 112.

System memory 112 includes a plurality of memory ranks, each made up of at least one dynamic random access memory (DRAM(s)) that can be accessed by memory controller 110 via a memory access address and data bus 218. In the illustrative embodiment, memory 112 is illustrated having four ranks, rank 0 225, rank 1 226, rank 2 227 and rank 3 228, with each rank having DRAMs 220-223 within which can be stored data 250-253. The term "memory rank" is used when referring to a subset of system memory 112 that has a set of DRAMs connected to the same address and data buses (generally shown by the arrows extending from memory access bus 218). Since all memory ranks share the same memory access bus 218, only one rank may utilize the memory access bus 218 at any given time, although accesses to multiple ranks may overlap. Data 250-253 can be stored in and retrieved from DRAMs 220-223 within ranks 225-228 through the operation of read and write commands.

Memory controller 110 contains the logic necessary to read and write to DRAMs 220-223 and to refresh the individual ranks of DRAMs 220-223 by periodically sending pulses of electrical current through each memory rank 225-228. Memory controller 110 comprises read reorder queue (RRQ) 210, read reorder queue logic (RRQ logic) 212, command scheduler (or final arbiter) 215, other control logic 240A-240N and refresh controller 230. Other control logic 240A-240N manages the overall operation of memory controller 110 and refresh controller 230 manages the periodic refreshing of memory ranks 225-228. Each of the memory controller components can communicate with each other via a communication fabric, which includes specific messaging signals communicated over specific signal lines, some of which are illustrated.

Functions, methods and processes of the present disclosure can be provided as firmware code and/or logic within memory controller 110. The firmware code and logic can include implementation of read reorder queue (RRQ) logic 212, command scheduler 215, which can also be referred to as final arbiter 215, other control logic 240A-240N, refresh controller 230, and programmable methods for controlling memory refresh operations of DRAMs 220-223 within respective ranks 225-228.

Read reorder queue 210 contains a plurality of register entries for holding reordered read commands to be executed on memory ranks 225-228. The illustrative embodiment provides eight register entries RRQ(0)-RRQ(7), enabling eight different read commands to be re-ordered and/or scheduled relative to each other. While eight slots or entries RRQ(0)-RRQ(7) are shown more or fewer entries can be used in different embodiments. Certain aspects of the operation of read reorder queue 210 can be controlled by read reorder queue logic 212, shown as a component of and/or associated with read reorder queue 210. In an alternate configuration, RRQ logic 212 can be functional logic within command scheduler 215, and the signal lines terminating at or originating from RRQ logic 212 would be replaced by appropriate signal lines to and from command scheduler 215, where required. Read reorder queue logic 212 at least partially determines the order of read commands stored in read reorder queue 210. Read reorder queue 210 allows for the order of pending read commands to different memory ranks 225-228 to be changed or rearranged into a different order such that higher priority read commands are sent to corresponding memory ranks 225-228 first, in one embodiment. Read reorder queue 210 receives read commands from command dispatch 207 and issues selected read commands to command scheduler 215.

Command scheduler (or final arbiter) 215 selects the order and timing of operations to be performed on memory ranks 225-228. Command scheduler 215 receives selected read commands or instructions from read reorder queue 210, a write reorder queue (not shown), refresh controller 230, and other miscellaneous resources, and command scheduler 215 orders these commands or instructions based on a given priority. Command scheduler 215 can schedule memory refresh operations on memory ranks 225-228 responsive to input of high priority refresh commands 233 or low priority refresh commands 234 from refresh controller 230.

Refresh controller 230 comprises refresh controller logic 232 and a plurality of counters including counter 0 235, counter 1, 236, counter 2 237 and counter 3 238. Refresh controller logic 232 determines when a refresh operation is to be executed on a specific one of memory ranks 225-228. Refresh controller logic 232 manages high latency memory operations such as memory refresh operations. Refresh controller logic 232 determines when a memory refresh operation or other high priority and/or high latency operation is required to be performed and schedules the memory refresh operation or other high latency operation so as to maximize the rate of data transfer to and from DRAM 220 for normal latency operations, such as read commands. It is appreciated that while refresh controller 230 is illustrated and described herein as controlling and managing the execution of memory refresh operations on DRAM 220, refresh controller 230 can be a general controller that is used to control and/or manage any high latency memory operation that can be performed on DRAMs 220-223 and for which advance knowledge of the scheduled time of execution is known.

Refresh controller 230 manages or controls high latency memory operations such as memory refresh operations, according to one embodiment. Refresh controller 230 determines when a memory refresh operation or other high latency operation is required to be executed on memory ranks 225-228 and triggers the command scheduler 215 and/or the RRQ logic 212 to prioritize a scheduling of all other read commands targeting the same rank as the memory refresh operation or other high latency operation so as to maximize the rate of data transfer to and from DRAMs 220-223 prior to the performance of the refresh operation on the particular rank. The maximum interval or time period between memory refresh operations is defined as tREFI. In one embodiment, a memory refresh operation is required to be performed within the tREFI interval to avoid a loss of data in memory ranks 225-228. Refresh controller logic 232 can keep track of the elapsed time since the previous memory refresh operation for a given rank of memory has occurred and/or a time before the next memory refresh operation will be initiated. This information is tracked for each rank 225-228 via a corresponding counter 235-238 assigned to that particular rank. The count can be a count up to a scheduled time for performing the high latency operation or a count down to expiration of the timer, at which the high latency operation is performed.

In one embodiment, counters 235-238 keep track of or count the number memory refresh operations that have been deferred to a future time period for each respective memory rank 225-228. Thus, counter 0 235 counts the number of deferred memory refresh operations for memory rank 0 225, counter 1 236 counts the number of deferred memory refresh operations for memory rank 1 226, counter 2 237 counts the number of deferred memory refresh operations for memory rank 2 227, and counter 3 238 counts the number of deferred memory refresh operations for memory rank 3 228. The deferred memory refresh operations are called memory refresh backlog counts. The joint electron devices engineering council (JEDEC) standard DRAM specification allows for the deferral of memory refresh operations up to a maximum limit of 8 deferrals. Memory refresh backlogs can be built up during periods of high memory bus utilization because memory refresh operations are typically assigned a lower priority than performance critical read commands. It is appreciated that while the described embodiments introduces a specific maximum limit, that limit is programmable and/or adjustable up or down based on and/or during the design of the memory access subsystem 200 or based on an operating condition of the memory access subsystem 200.

Refresh control logic 232 can monitor the count of deferred memory refresh operations as tracked by counters 235-238 and periodically schedule memory refresh operations by issuing a low priority refresh (N) command 234 to command scheduler 215 for one of the N memory ranks. In response to receiving the low priority refresh (N) command 234, command scheduler 215 can defer the scheduling of the low priority refresh command, for example, when there are a large number of normal read operations within the read reorder queue targeting that memory rank.

Refresh control logic 232 can detect when any one of counters 235-238 reaches a high priority threshold level or number of deferred memory refresh operations. For example, the high priority threshold number can be a count of six when the maximum count of deferred memory refresh operations is eight. The high priority threshold can be pre-determined and is programmable or changeable. When any one of counters 235-238 reaches the high priority threshold, refresh control logic 232 issues a high priority refresh (N) command 233 for a corresponding one of the N memory ranks to command scheduler 215. In response to receiving the high priority refresh (N) command 233, command scheduler 215 dynamically elevates the priority of the pending memory refresh for the given memory rank above that of any read or write commands. Command scheduler 215 schedules a memory refresh operation for that memory rank to be performed.

When a high latency operation such as a memory refresh operation is issued, commands in the read reorder queue 210 targeting the same memory rank cannot be issued until the memory refresh operation to that memory rank is completed. The pending read commands targeting the same rank that is being refreshed take up space in the read reorder queue and effectively decreases the size of the read reorder queue 210 while the memory refresh operation is in progress.

In one embodiment, refresh control logic 232 can detect when any one of counters 235-238 has exceeded a pre-determined early threshold count and refresh control logic 232 sends an early high priority refresh (N) notification 244 for a given memory rank N from refresh controller 230 to read reorder queue logic 212. The early high priority refresh (N) notification 244 signals read reorder queue logic 212 that a high priority memory refresh command or request is approaching in the near future for a given memory rank. In response to receiving the early high priority refresh (N) notification 244, read reorder queue logic 212 changes or biases its scheduling algorithm to give priority to those commands in the read reorder queue 210 that are targeting the same memory rank N as the impending memory refresh operation. The time delay between the early high priority refresh (N) notification 244 and the actual high priority refresh operation, which is triggered by a high priority (N) command 233 is programmable within refresh control logic 232.

Aspects of the present disclosure are based on an understanding that it is desirable to drain read reorder queue 210 of as many read commands as possible prior to the occurrence of the memory refresh operation. Specifically, the one or more embodiments are directed to reducing the number of memory access commands within the RRQ that target a specific memory rank that is about to be refreshed. Generally, the described early notification functionality triggers a faster depletion of remaining commands targeting the same first memory rank within the re-order queue before the high priority, high latency operation is performed at the first memory rank. The read commands to other memory ranks can be issued while the high latency memory refresh operation is in progress on a first memory rank and awaiting completion. Thus the early removal of these specific read commands from the read reorder queue 210 allows the read reorder queue 210 to be available to hold read commands targeting other memory ranks when a high latency operation such as a memory refresh operation is executing on one of the memory ranks 225-228. This improves the overall performance and utilization of read reorder queue 210, the memory access bus 218, and DRAMs 220-223.

When the count/value contained in a counter 235-238 assigned to a particular memory rank is less than the high priority threshold count, command scheduler 215 and read reorder queue logic 212 can cause commands to that memory rank to be prioritized over a low (or normal) priority memory refresh request. The memory refresh is deferred as long as there are read commands in the read reorder queue 210 directed to the same memory rank. Each time a refresh is deferred, the value of the count is incremented by one (or decremented for a decreasing counter), in one or more embodiments. When the count contained in the counter 235-238 for a particular memory rank increases to be equal to the high priority threshold level, a memory refresh operation is considered a high priority memory refresh operation and can no longer be deferred. Refresh control logic 232 of refresh controller 230 informs command scheduler 215 to execute a high priority memory refresh operation. In one embodiment, refresh control logic 232 asserts a high priority (N) refresh command 233 to command scheduler 215 which causes command scheduler 215 to withhold scheduling any read commands in the read reorder queue 210 that targets the same memory rank as the high priority refresh command, and command scheduler 215 also triggers and/or initiates the performance of the refresh on the particular memory rank.

In one embodiment, the early high priority refresh (N) notification 244 can be used by read reorder queue logic 212 to prevent or block any new read commands to the same memory rank targeted for a memory refresh from entering read reorder queue 210 from command dispatch 207. Read reorder queue 210 is thereby prevented from re-filling with read commands to the same memory rank at the same time that command scheduler 215 is draining the read reorder queue 210 of commands to the same memory rank in preparation for the memory refresh operation at that rank.

In one embodiment, RRQ logic 212 monitors for completion of all the read commands in the read reorder queue 210 that targets the same memory rank as a pending high priority memory refresh operation. If there are no commands left in the read reorder queue 210 to be issued to the same memory rank that is to be refreshed, read reorder queue logic 212 can send an early done notification 246 to refresh controller 230, which notification indicates that there are no remaining commands to the target rank within the queue. In response to receiving the early done notification 246, refresh controller logic 232 can instruct command scheduler 215 to initiate the memory refresh operation at the targeted memory rank, as the next command ahead of commands from the read reorder queue 210. This condition which triggers early processing of a pending high priority memory refresh operation can be referred to as an early done condition.

Figure 3A:
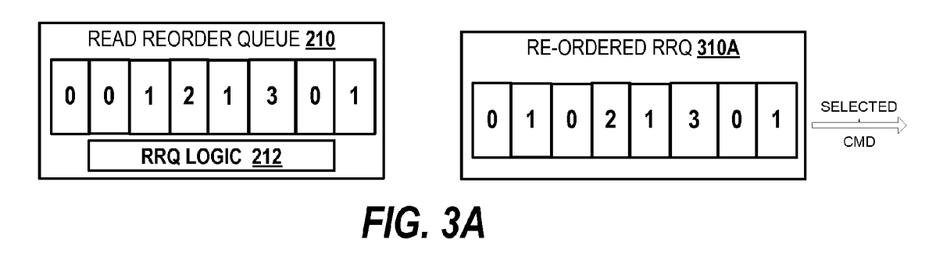
FIG. 3A illustrates the contents of an example read reorder queue before and after reordering operations according to one embodiment.

With continued reference to FIG. 2, FIG. 3A illustrates examples of an initial read reorder queue 210 and a re-ordered read reorder queue 310A are shown. Initial read reorder queue 210 contains eight entries (registers) RRQ0-RRQ7 (from right to left) that contain commands targeting different memory ranks 225-228 of four possible memory ranks. The specific rank being targeted by an entry of read reorder queue is indicated by integers 0-3 placed within the individual entries. For example, assuming the registers are sequentially, from right to left, register 0 (Reg0) through register 7 (Reg7), then Reg0 contains a command targeting memory rank (1) and Reg7 contains a command targeting memory rank (0). In the presented embodiment, read reorder queue 210 is a first in first out queue (FIFO). The sequence of commands in read reorder queue 210 targets memory ranks in the order sequence of (10312100). The next read command or instruction issued from read reorder queue 210 is from Reg0 and targets memory rank (1). Read reorder queue logic 212 can change or reorder the sequence of commands targeting the memory ranks to allow for more efficient utilization of the data bus 218, as illustrated in re-ordered read reorder queue 310A. The sequence of commands in re-ordered read reorder queue 310A targets memory ranks in the new order sequence of (10312010).

Figure 3B:
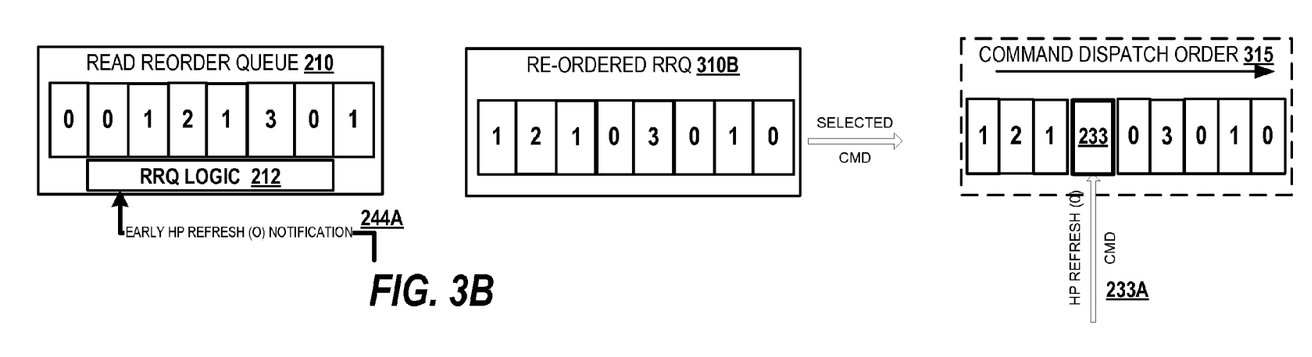
FIG. 3B illustrates the contents of an example read reorder queue before and after reordering operations in response to an early high priority refresh notification according to one embodiment.

FIG. 3B illustrates initial read reorder queue 210 and a re-ordered read reorder queue 310B, which is re-ordered based on a receipt of early high priority refresh (0) notification 244A. Early high priority refresh (0) notification 244A indicates a pending high priority refresh operation targeting a first memory rank or Rank (0) 225. As with FIG. 3A, register −1 contains a read command targeting the first memory rank (Rank 0) and registers 6 and 7 both contain a command targeting the first memory rank or (Rank 0). Other ranks are targeted by the read commands in the remaining registers. The initial sequence of commands in read reorder queue 210 targets memory ranks in the order sequence of (10312100). The next read command or instruction issued from read reorder queue 210 is from register 0 and targets memory rank (1). In response to receiving an early high priority refresh (0) notification 244A for memory rank (0) from refresh controller 230, read reorder queue logic 212 can change or reorder the sequence of commands targeting the memory ranks as illustrated in re-ordered read reorder queue 310B.

Relative to the scheduling of read commands at the command scheduler 215, high priority refresh (0) command 233A would then be initiated at the location shown within command dispatch order 315. As shown, high priority refresh (0) operation 233 would be performed by command scheduler 215 (FIG. 2) following the scheduling of all read commands targeting the first memory rank (R0), such that the read reorder queue is drained of these read commands by the time the high priority refresh (0) command 233A issues. The sequence of commands in re-ordered read reorder queue 310B targets memory ranks in the new order sequence of (01030121). As illustrated by command dispatch order 315, all of the read commands to memory rank (0) in re-ordered read reorder queue 310B are now scheduled or ordered to be completed before the memory refresh operation 233 to memory rank (0) is initiated. In other words, the read commands to memory rank (0) are pushed towards the front of the queue for priority scheduling relative to other commands targeting other memory ranks. According to this embodiment, while higher priority is given to first commands targeting the first rank, dispatching of commands to other ranks are still interspersed between the priority scheduling of these first commands, to account for the fact that commands targeting other ranks can be scheduled (based on their initial ordering) while a previously scheduled first command is completing on the first rank.

Figure 3C:
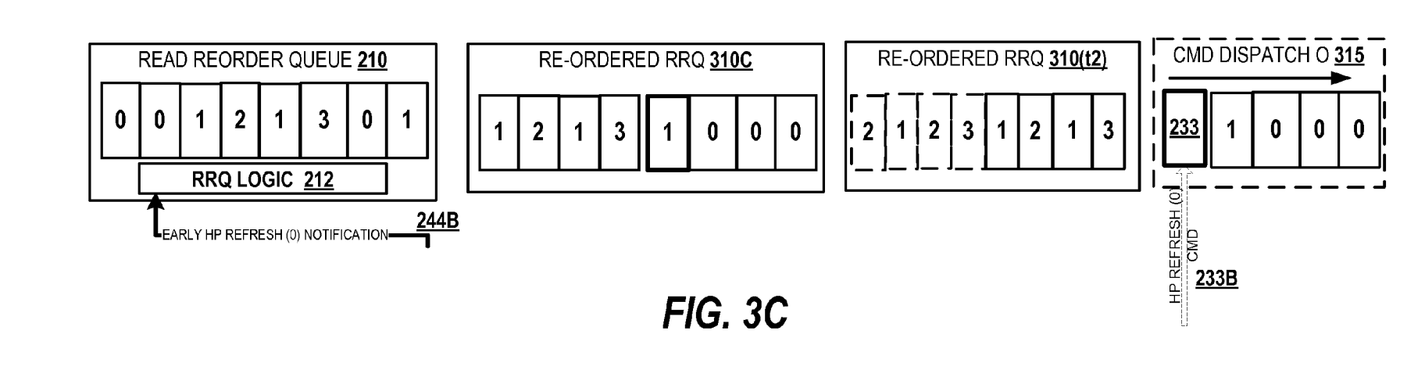
FIG. 3C illustrates the contents of an example read reorder queue before and after reordering operations in response to an early high priority refresh notification according to one embodiment.

FIG. 3C illustrates a different scheduling of commands within re-ordered read reorder queue 310C, relative to the scheduling of commands in re-ordered read reorder queue 310B based on receipt of an early high priority refresh (0) notification 244B. Initial register values of read reorder queue 210 are the same as those of FIG. 3B. Thus, the sequence of commands in read reorder queue 210 targets memory ranks in the order sequence of (10312100). In response to receiving an early high priority refresh (0) notification 244B for first memory rank (0) from refresh controller 230, read reorder queue logic 212 can change or reorder the sequence of commands targeting the memory ranks as illustrated in re-ordered read reorder queue 310C.

The sequence of commands in reordered read reorder queue 310C targets memory ranks in the new order sequence of (00013121). It is noted that all of the read commands to memory rank (0) in reordered read reorder queue 310C are given first priority relative to all other read commands and also scheduled or ordered to be completed before the high priority memory refresh operation to memory rank (0) occurs. In other words, the read commands to memory rank (0) are pushed to the front of the queue. In terms of the dispatch order (315) from command scheduler 215, high priority refresh (0) operation 233 triggered by high priority refresh (0) command 233B is indicated as sequentially scheduled after read commands previously located in queue registers, RRQ0-RRQ3, such that high priority refresh (0) operation 233 is scheduled at a time that is after dispatch and completion of all read commands targeting the first rank (0) as well as after dispatch of the next read command.

While dispatch of the first commands is shown to be completed ahead of the time of initiation of the high priority refresh (0) operation in the above embodiments, the functional aspects of the disclosure are also applicable to embodiments in which only some of the scheduled read commands can be issued ahead of the high priority refresh (0) operation. The net effect of the embodiments is to bias the read re-order queue to advance schedule any of the first commands that would otherwise remain in the read reorder queue and take up valuable queue space while the refresh operation is being performed on the particular rank. Additionally, according to one embodiment and as shown by re-ordered read reorder queue 310(t2), where t2 represents a later time following priority execution of the first read commands and just prior to execution by command scheduler 215 of the high priority refresh (0) operation, re-ordered read reorder queue 310(t2) has received an input of several new commands from command dispatch 207; However, none of new read commands targets the first rank (0) of DRAMs 220 that is about to be refreshed.

Figure 4:
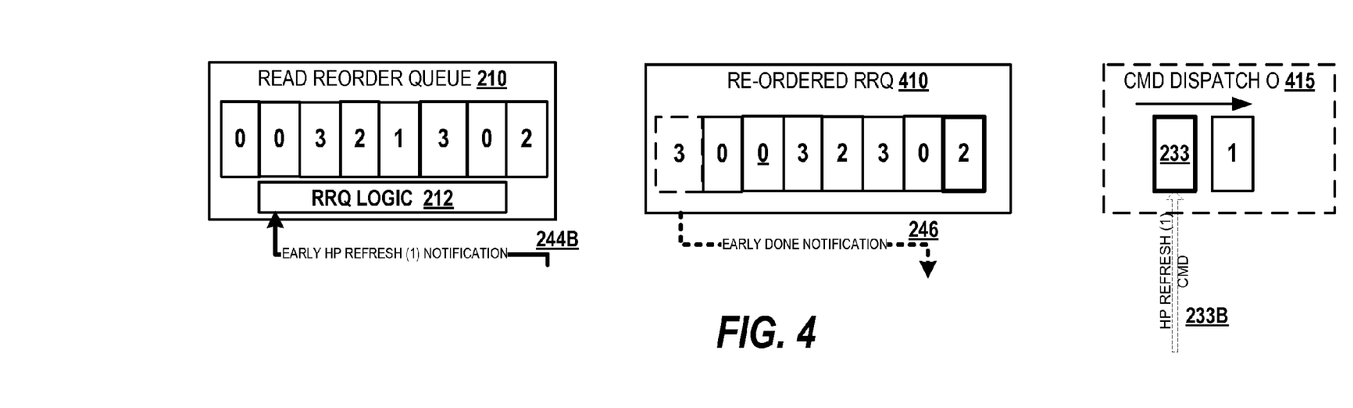
FIG. 4 illustrates the contents of an example read reorder queue before and after reordering operations in response to an early done notification according to one embodiment.

FIG. 4 illustrates an initial read reorder queue 210 and a re-ordered read reorder queue 410 showing an early done condition following receipt at read reorder queue 210 of early high priority refresh (1) notification 244B. Register 3 contains a command targeting memory rank (1) and all other registers contains a command targeting a different memory rank. The initial sequence of commands in read reorder queue 210 at the time of receipt of the refresh (1) notification 244B targets memory ranks in the order sequence of (20312300). The next read command or instruction scheduled to be issued from read reorder queue 210 is from register 0 and targets memory rank (2). In response to receiving an early high priority refresh (1) notification 244B for memory rank (1) from refresh controller 230, read reorder queue logic 212 biases the queue to give priority to the read command targeting rank (1) and issues that read command ahead of the other read commands in the read reorder queue 210. Because this was the only command targeting rank (1), the read reorder queue is drained of all relevant commands prior to expiration of the early notification period. In this scenario, and according to one or more embodiments, RRQ logic 212 issues an early done signal 246 to refresh controller 230. The early done signal 246 indicates that there are no remaining commands to target rank notification 246. Responsive to receiving the early done signal 246, refresh controller 230 issues the high priority refresh (1) command 233B to command scheduler 215, which causes command scheduler 215 to initiate the refresh of rank 1 226 in memory 112. High priority refresh (1) operation 233 is shown as being dispatch immediately after completion of the read command to rank 1 within command dispatch order 415. High priority refresh (1) command 233B is thus selected ahead of the other read commands, including the read command currently in register RRQ0. Because there are no remaining read commands in re-ordered read reorder queue 410 targeting memory rank (1), the memory refresh operation 233 can be started earlier, relative to the normal time at which the refresh command would have been scheduled to begin.

Figure 5A:
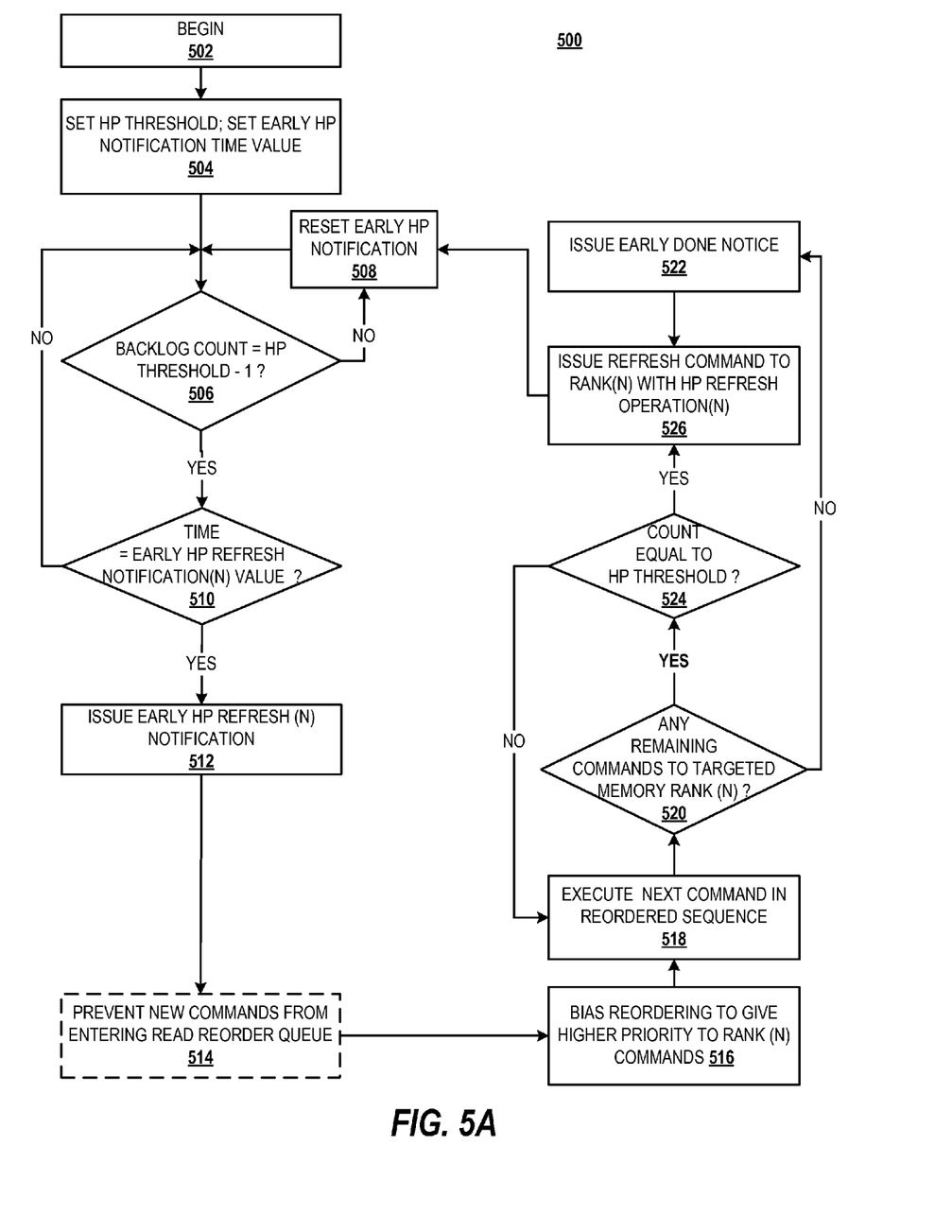
FIG. 5A provides a flowchart illustrating the method processes for controlling memory refresh operations according to one embodiment.

FIG. 5A illustrates a flowchart of an exemplary process for controlling memory refresh operations according to an illustrative embodiment. In the discussion of FIG. 5, reference is also made to elements described in FIG. 2. Method 500 can be implemented in memory controller 110. In an embodiment, method 500 can increase the performance of a memory system, such as memory system 112 of FIG. 1, by recognizing that a high latency operation such as a refresh operation for a memory rank is to about occur in the near future and modify the order of read commands in read reorder queue 210 to drain the read reorder queue of any commands targeting the same memory rank. Various aspects of the method can be completed by different logic components within memory controller 110. However, for simplicity, method 500 is described as being completed generally by memory controller logic or more specifically by refresh controller logic.

The method of FIG. 5A begins at block 502. Refresh controller logic 232 sets the high priority threshold or maximum count value and a corresponding early high priority refresh notification time value for each memory rank (block 504). In an embodiment, the high priority threshold is programmable and can be set at the maximum number of JEDEC standard DRAM memory refresh defers, which is 8 deferrals for a given memory rank. In one embodiment, in order to avoid each rank being refreshed at the same time, the tREFI timer for the ranks can be staggered. The early high priority refresh notification time can be pre-determined and can be defined as any time delay that is less than one tREFI interval, with the high priority threshold being 8 refresh deferrals, in one embodiment. In other embodiments, a larger or smaller time delay period can be used to determine the early high priority refresh notification time and/or larger or smaller backlog count values can be used for the high priority threshold.

Refresh controller logic 232 checks if the backlog count is equal the high priority threshold −1 (block 506). If the backlog count does not equal the high priority threshold −1, the early high priority notification is reset (block 508) and then returns to decision block 506. If the backlog count is equal to the high priority threshold −1, method 500 proceeds to block 510.

Refresh controller logic 232 checks to see if the time is equal to a pre-established early high priority refresh notification value (N) for that rank (block 510). If the time is not equal to the early refresh notification (N) value for the memory rank, processing of method 500 returns to block 506 where refresh controller logic 232 continues to track the backlog count if the time is equal to an early high priority refresh notification (N) value for a memory rank, refresh controller logic 232 of refresh controller 230 issues an early high priority refresh (N) notification 244 to read reorder queue logic 212 (block 512). The early high priority refresh notification provides an early notification and/or warning that a high priority, memory refresh operation will occur in the near future for memory rank (N).

In response to the early high priority refresh (N) notification 244, read reorder queue logic 212 can prevent read commands to the targeted memory rank from entering read reorder queue 210 (block 514). Thus, receipt of an early high priority refresh (N) notification can be used to prevent or block any new read commands to the same memory rank from entering read reorder queue 210 from any upstream queues, in one embodiment. The read reorder queue 210 is thereby prevented from re-filling with read commands to the same memory rank at the same time that command scheduler 215 is attempting to drain the read reorder queue 210 of commands to the targeted memory rank prior to the memory refresh operation. In certain embodiments, the process performed at block 514 can be omitted from method 500.

Also, in response to the early high priority refresh (N) notification 244, read reorder queue logic 212 biases its reordering to assign a higher priority to the scheduling order of pending read commands to the memory rank targeted by the pending memory refresh operation (block 516). Command scheduler 215 processes the next high priority read command in the reordered sequence (block 518) prior to the backlog count for that memory rank hitting the high priority threshold. This prioritization and early scheduling of the particular read commands allow the read reorder queue 210 to be available to hold read commands to the other memory ranks other than the targeted memory rank when the memory refresh operation is executing on the targeted memory rank. The read commands to other memory ranks can be issued while the high latency memory refresh operation is in progress and awaiting completion. Ultimately, the above processing improves the overall performance and utilization of read reorder queue 210, the memory bus and DRAMs 220 within memory 112.

At decision block 520, read reorder queue logic 212 determines if there are any remaining commands in read reorder queue 210 targeting the same memory rank targeted by the pending high priority memory refresh operation (block 520). If there are no commands in read reorder queue 210 targeting the same memory rank targeted by the memory refresh operation, read reorder queue logic 212 sends an early done notice 246 to refresh controller 230 indicating that there are no remaining commands to that target rank (block 522). Refresh controller logic 232 informs command scheduler 215 to perform or execute the memory refresh operation for the targeted memory rank at an earlier time than the high priority refresh would have been scheduled (block 526).

If there are commands remaining in read reorder queue 210 that target the same memory rank as the pending high priority memory refresh operation (block 520), refresh controller logic 232 determines if the count of deferred refresh operations is equal to the high priority threshold (block 524). If the count of deferred refresh operations is equal to the high priority threshold, refresh controller logic 232 triggers command scheduler 215 to issue the refresh command to rank (N) with a high priority refresh operation (block 526). The memory refresh operation is executed to initiate the refresh of the particular rank. If the count of deferred refresh operations is not equal to the high priority threshold, method 500 returns to step 518 where command scheduler 215 continues to process the next read command in the reordered sequence. After a memory refresh operation (block 526) has been completed, method 500 returns to step 508 where refresh controller logic 232 resets the early high priority threshold.

Figure 5B:
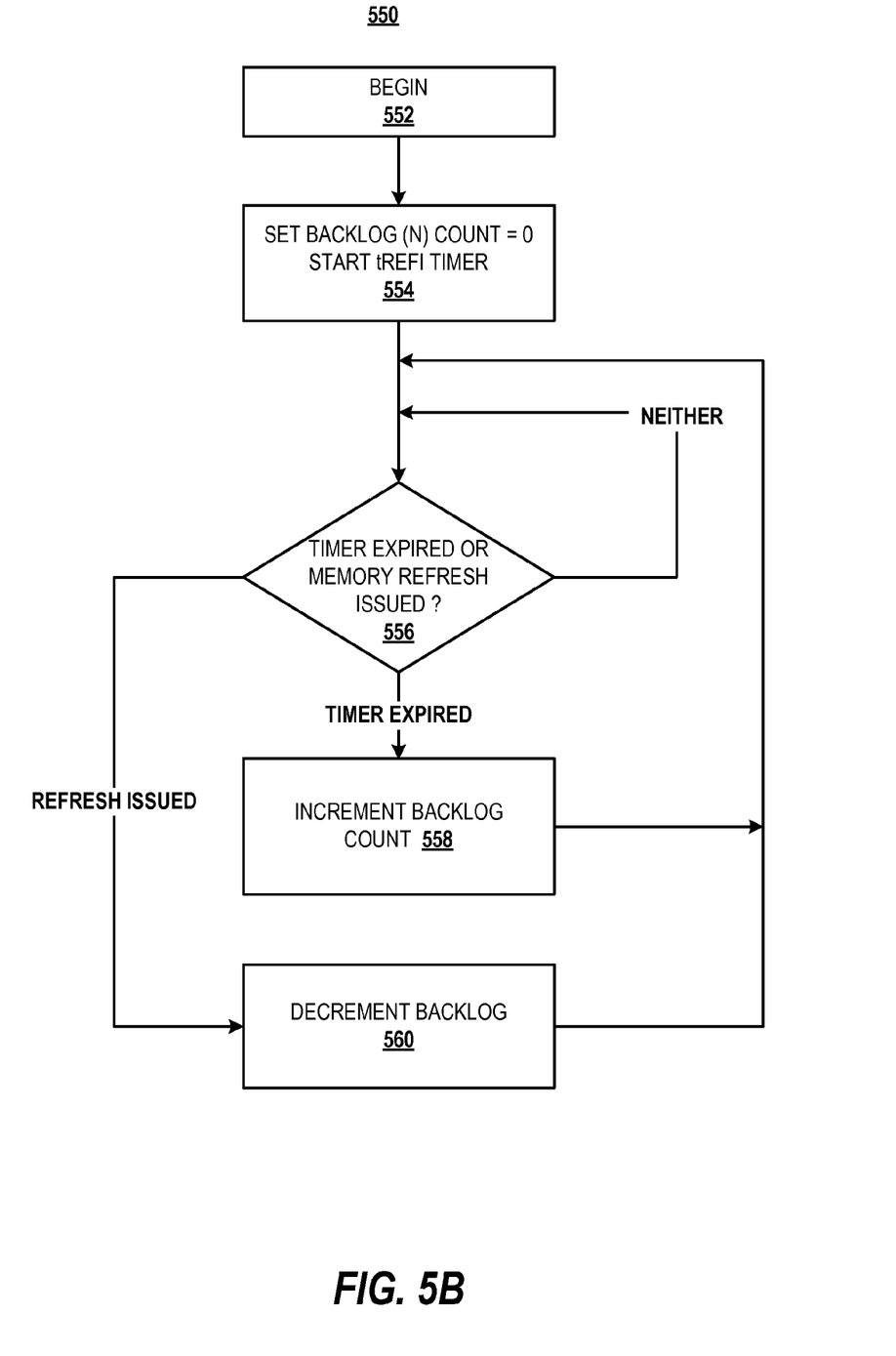
FIG. 5B is a flowchart illustrating the method processes for controlling scheduling of memory access operations, including high priority high latency memory operations, according to one embodiment.

FIG. 5B is a flow chart illustrating a specific implementation of a method 550 that can operate in parallel with method 500 shown in FIG. 5A. Referring to the figure, method 550 begins at block 552 and proceeds to block 554 where refresh controller logic 232 initializes counters 235-238 by setting counters 235-238 to an initial value, such as zero, and then starting a tREFI timer. Refresh controller logic 232 determines if the tREFI timer has expired or a memory refresh operation command has been issued (block 556). In response to the tREFI timer expiring, the backlog count is incremented by refresh controller logic 232 (block 558). In response to a memory refresh command being issued, the backlog count is decremented by refresh controller logic 232 (block 560). In response to neither the tREFI timer expiring nor the memory refresh command being issue, method 550 returns to block 556 and iterates until one of the two conditions occurs.

In one embodiment, the method comprises the memory controller tracking a time remaining before a scheduled time by: setting a counter to track a period between performing a previous high priority, high latency operation and the high priority, high latency operation; performing the high priority, high latency operation when the counter expires; and resetting the counter to track a next high priority, high latency operation. Depending on specific implementation, the scheduled time for performing a next high priority, high latency operation can be known to the memory controller logic based on one of (a) a pre-established periodicity for performing high priority, high latency operations and (b) an advance notification of the scheduled time to a next high priority, high latency operation. The advance notification can originate from a connected processor or other component that performs high latency memory accesses.

Figure 6:
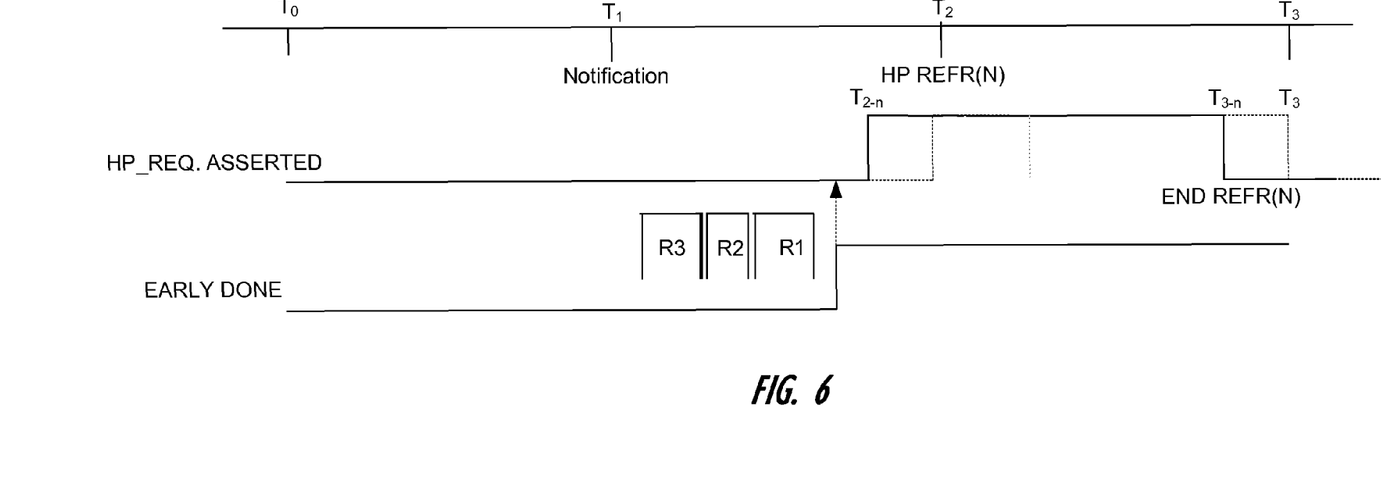
FIG. 6 is a timing diagram that illustrates a memory refresh cycle according to one embodiment.

Referring now to FIG. 6, which illustrates a time line or timing diagram of time periods $T_0$-$T_3$ for a memory refresh cycle based on a timed counter (FIG. 5) with an early done condition. With additional reference to FIG. 2, the issuance of several commands by refresh controller 230, refresh controller logic 232 and command scheduler 215 are shown during the memory refresh cycle including a pending high priority refresh command for a given rank (N) of memory, and the execution of the high priority refresh command for a given rank (N) of memory.

At time $T_0$, the refresh backlog count has been incremented to a value equal to the HP refresh threshold −1. At time $T_1$, an early high priority refresh (N) notification 233 is issued for a rank (N) of memory from refresh controller 230 due to a pending high priority refresh command, scheduled to be initiated at time $T_2$. If the state of the RRQ 210 allows for a refresh to be issued prior to $T_1$ due to there bring no commands in the RRQ 210 targeting the same rank (N), then the early notification is not issued since the backlog count is decremented due to the issued refresh. After time $T_1$, command scheduler 215 processes three read commands from read reorder queue 210 that targets a same rank (N) as the pending high priority refresh command. When read reorder queue 210 contains no more read commands targeting the memory rank (N), read reorder queue sends an early done signal or notification 246 to refresh controller logic 232 of refresh controller 230. This occurs at an earlier time than $T_2$, which is represented as time $T_{2-N}$, where N is a real value of time prior to $T_2$. Command scheduler 215 issues the refresh command to the memory rank (N) of DRAM devices 220 at $T_{2-N}$, and the refresh operation executes between time periods $T_{2-N}$ and $T_{3-N}$. The memory refresh cycle ends at time $T_{3-N}$, rather than at time $T_3$. Thus, the issuance of the early done signal or notification 246 by read reorder queue logic 232 allows the memory refresh operation to be complete earlier than would otherwise occur. This allows new read commands targeting the same memory rank to be scheduled earlier than if the new read commands had to wait until expiration of time $T_3$.

One or more of the described embodiments provide a method, a memory system and a data processing system for controlling memory refresh operations. The described embodiments improve the performance of a memory system by allowing memory read operations to occur prior to the occurrence of a high latency operation such as a memory refresh. By notifying a command scheduler in advance of when a memory refresh is required, the command scheduler can modify the order of execution of read commands in a read reorder queue and issue read commands targeting the same memory rank as the memory refresh operation prior to that operation being initiated. Read commands to other memory ranks can be issued while the high latency memory refresh operation is in progress. This improves the overall performance and utilization of the read reorder queue, the memory bus and the dynamic random access memory.

In each of the flow charts above, one or more of the methods may be embodied in a computer readable medium containing computer readable code such that a series of steps are performed when the computer readable code is executed on a computing device. In some implementations, certain steps of the methods are combined, performed simultaneously or in a different order, or perhaps omitted, without deviating from the spirit and scope of the disclosure. Thus, while the method steps are described and illustrated in a particular sequence, use of a specific sequence of steps is not meant to imply any limitations on the disclosure. Changes may be made with regards to the sequence of steps without departing from the spirit or scope of the present disclosure. Use of a particular sequence is therefore, not to be taken in a limiting sense, and the scope of the present disclosure is defined only by the appended claims.

As will be appreciated by one skilled in the art, aspects of the present disclosure may be embodied as a system, method or computer program product. Accordingly, aspects of the present disclosure may take the form of an entirely hardware embodiment or an embodiment combining software and hardware aspects that may all generally be referred to herein as a "circuit," "module" or "system." Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, R.F, etc., or any suitable combination of the foregoing. Computer program code for carrying out operations for aspects of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks. The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Thus, it is important that while an illustrative embodiment of the present disclosure is described in the context of a fully functional computer (server) system with installed (or executed) software, those skilled in the art will appreciate that the software aspects of an illustrative embodiment of the present disclosure are capable of being distributed as a program product in a variety of forms, and that an illustrative embodiment of the present disclosure applies equally regardless of the particular type of media used to actually carry out the distribution.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular system, device or component thereof to the teachings of the disclosure without departing from the essential scope thereof. Therefore, it is intended that the disclosure not be limited to the particular embodiments disclosed for carrying out this disclosure, but that the disclosure will include all embodiments falling within the scope of the appended claims. Moreover, the use of the terms first, second, etc. do not denote any order or importance, but rather the terms first, second, etc. are used to distinguish one element from another.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A method of operating a memory system, the method comprising:
   a memory controller tracking a time remaining before a scheduled time for initiating a high priority, high latency operation to a first memory rank of the memory system, wherein a plurality of memory ranks are individually accessible by different memory access operations scheduled from a command re-order queue of the memory controller, wherein the scheduled time of the high priority, high latency operation is a future time, and wherein the command re-order queue contains memory access operations targeting the plurality of memory ranks;
   in response to the time remaining reaching a pre-established early notification time before the schedule time for initiating the high priority, high latency operation:
      biasing the re-order queue to prioritize scheduling of any first memory access operations that target the first memory rank; and
      scheduling the first memory access operations to the first memory rank for early completion relative to other memory access operations in the command re-order queue that target other memory ranks of the plurality of memory ranks, wherein the scheduling of the first memory access operations to the first memory rank for early completion causes the first memory access operations to be completed before performing the high priority, high latency operation at the first memory rank; and
   performing the high priority, high latency operation at the first memory rank at the scheduled time;
   wherein the biasing of the command re-order queue and scheduling of the first memory access operations triggers a faster depletion of first memory access commands remaining within the command re-order queue before the high priority, high latency operation is performed at the first memory rank.

2. The method of claim 1, wherein the memory controller tracking the time remaining before the scheduled time further comprises:
   setting a counter to track a period between performing a previous high priority, high latency operation and the high priority, high latency operation;
   performing the high priority, high latency operation when the counter expires; and
   resetting the counter to track a next high priority, high latency operation, wherein a scheduled time for performing a next high priority, high latency operation is known based on one of a pre-established periodicity for performing high priority, high latency operations and an advance notification of the scheduled time to a next high priority, high latency operation.

3. The method of claim 1, wherein the high priority, high latency operation is a high priority memory refresh operation and the memory access operations are read commands, and the method comprises:
   determining a count of deferred memory refresh operations for the first memory rank;
   in response to the count approaching a high priority threshold, issuing an early high priority refresh notification for the first memory rank, wherein the high priority threshold indicates the scheduled time for performing a memory refresh operation as a high priority memory refresh operation at the first memory rank;
   in response to issuance of the early high priority refresh notification, modifying a read re-order queue to give priority scheduling to at least one read command targeting the first memory rank; and
   executing one or more of the at least one read command on the first memory rank according to the priority scheduling.

4. The method of claim 3, further comprising:
   in response to the count being equal to the high priority threshold, refreshing the first memory rank.

5. The method of claim 4, further comprising preventing at least one new read command that is targeting the first memory rank from entering the read re-order queue following receipt of the early high priority refresh notification and until performance of the high priority refresh operation reaches a pre-determined completion point.

6. The method of claim 3, further comprising deferring a memory refresh operation to the first memory rank in response to the count not being equal to the high priority threshold.

7. The method of claim 3, further comprising;
   in response to the read re-order queue not having any remaining read commands that target the first memory rank prior to the count being equal to the high priority threshold, refreshing the first memory rank prior to the scheduled time; and
   resetting the count to an initial state and begin tracking a next count for a next high priority memory refresh operation.

* * * * *